United States Patent
Furukawa (10) Patent No.: US 6,919,706 B2
(45) Date of Patent: Jul. 19, 2005

(54) VOLTAGE MEASURING CIRCUIT OF BATTERY PACK

(75) Inventor: Kimihiko Furukawa, Hirakata (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 10/399,033

(22) PCT Filed: Mar. 13, 2002

(86) PCT No.: PCT/JP02/02388

§ 371 (c)(1),
(2), (4) Date: Apr. 17, 2003

(87) PCT Pub. No.: WO02/095863

PCT Pub. Date: Nov. 28, 2002

(65) Prior Publication Data

US 2004/0041569 A1 Mar. 4, 2004

(30) Foreign Application Priority Data

May 17, 2001 (JP) .................................... 2001-148171

(51) Int. Cl.[7] .............................................. H02J 7/00
(52) U.S. Cl. ..................................................... 320/116
(58) Field of Search ................................ 320/116, 106; 324/426, 434

(56) References Cited

U.S. PATENT DOCUMENTS

| | | | | |
|---|---|---|---|---|
| 6,104,164 A | * | 8/2000 | Iino et al. | 320/116 |
| 6,255,826 B1 | * | 7/2001 | Ohsawa et al. | 324/426 |
| 6,313,637 B1 | * | 11/2001 | Iino et al. | 324/434 |
| 6,456,035 B1 | * | 9/2002 | Crisp et al. | 320/106 |

FOREIGN PATENT DOCUMENTS

| | | |
|---|---|---|
| JP | 9-139237 | 5/1997 |
| JP | 10-289037 | 10/1998 |
| JP | 11-160367 | 6/1999 |
| JP | 11-160371 | 6/1999 |
| JP | 2000-134818 | 5/2000 |
| JP | 2000-199771 | 7/2000 |
| JP | 2000-277174 | 10/2000 |
| JP | 2000-287370 | 10/2000 |
| JP | 2001-56350 | 2/2001 |
| JP | 2001-116776 | 4/2001 |

* cited by examiner

*Primary Examiner*—Pia Tibbits
(74) *Attorney, Agent, or Firm*—Armstrong, Kratz, Quintos, Hanson & Brooks, LLP (57) ABSTRACT

A voltage detecting circuit for a cell combination including one or more cell blocks having a plurality of cell modules connected to each other in series, including voltage detecting lines extending, respectively, from a plurality of voltage detecting points of the cell combination, of the lines is connected to the ground, and nongrounding voltage detecting lines are each interconnected through voltage branch lines to the grounding voltage detecting line. A voltage dividing resistor is interposed on each of the nongrounding voltage detecting lines and each of the voltage branch lines. Each of the nongrounding voltage detecting line is connected to a computing circuit via an analogue-digital converter. The computing circuit calculates voltage of each of cell modules based on voltage detecting data input from each of the nongrounding voltage detecting lines. Accordingly, the number of parts is reduced, voltage detecting accuracy is improved, and disconnection is reliably detected.

8 Claims, 7 Drawing Sheets

DIFFERENTIAL COMPUTING CIRCUIT

FIG. 12 PRIOR ART

VOLTAGE MEASURING CIRCUIT OF BATTERY PACK

BACKGROUND OF THE INVENTION

1. Field of the Invention

The present invention relates to a circuit for detecting voltage of cells in combination for use as a power source for drive motors for electric motor vehicles.

2. Description of the Related Art

Power sources conventionally mounted in electric motor vehicles, such as hybrid cars, for drive motors comprise secondary cells connected in series for use in combination. Because combinations of such cells need to produce a high voltage of 200 to 300 V, for example, 60 to 80 lithium secondary cells each having an output of about 3.6 V are connected in series, or about 200 NiMH secondary cells each having an output of about 1.2 V are connected in series for use in combination.

With the combination of cells, it is desired that all the secondary cells be equivalent in a charged state. Suppose one secondary cell is 70% in charging rate, and another secondary cell is 50% in charging rate. In this case, the amount of electricity chargeable into these cells in combination is 30% which corresponds to the amount of charge for the cell with the charging rate of 70% when it is to be charged to the full. If the two cells are charged to an amount in excess of 30%, the secondary cell with the charging rate of 70% will be charged more than 100% to become greatly shortened in life. Consequently the combination of cells is also shortened in life.

Figure 10:
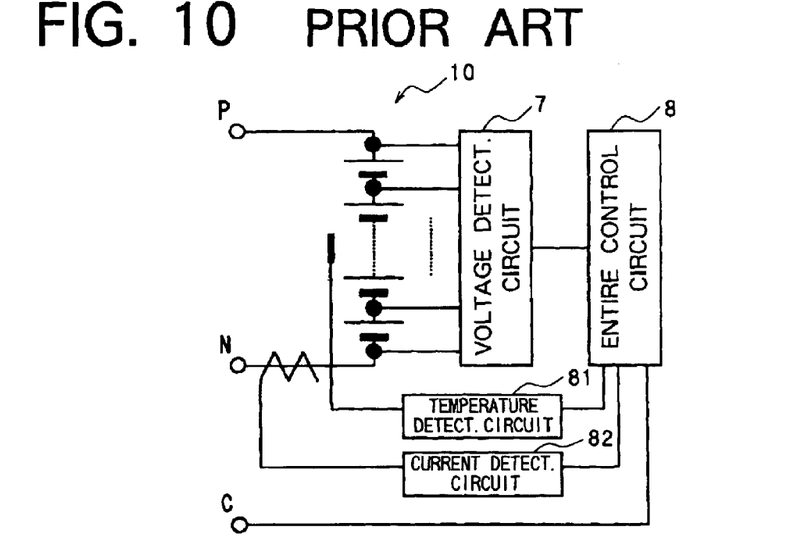
FIG. 10 is a block diagram showing the construction of a conventional cell monitoring system.

Accordingly, it is practice to monitor the voltages of the individual cells in combination using a voltage monitoring system having the construction shown in FIG. 10. In the case of the system, a plurality of secondary cells are connected in series to provide a cell module, and such modules are connected in series to provide a cell combination 10. Voltage detecting lines extend, respectively, from the opposite terminals of the cell combination 10 and from the points of connection between cell modules, and are connected to a voltage detecting circuit 7. The voltage of the individual cell modules detected by the voltage detecting circuit 7 is fed to an entire control circuit 8. The temperature of the cells is detected by a temperature sensor circuit 81, and the current flowing through the cells is detected by a current sensor circuit 82. The detection results are fed to the entire control circuit 8. The entire control circuit 8 calculates the amounts of electricity remaining in the cell and checks the cells for abnormalities based on the input data The result of monitoring is sent to an external control system through a communication line.

With the voltage monitoring system described, while the cell combination 10 as a whole has a voltage of 200 V to 300 V, a NiMH secondary cell, for example, has a voltage of about 1.2 V. Thus it is difficult to determine the state of individual secondary cells only by monitoring the entire voltage. Consequently, the voltage monitoring system needs to monitor the voltage for at least individual modules.

Figure 11:
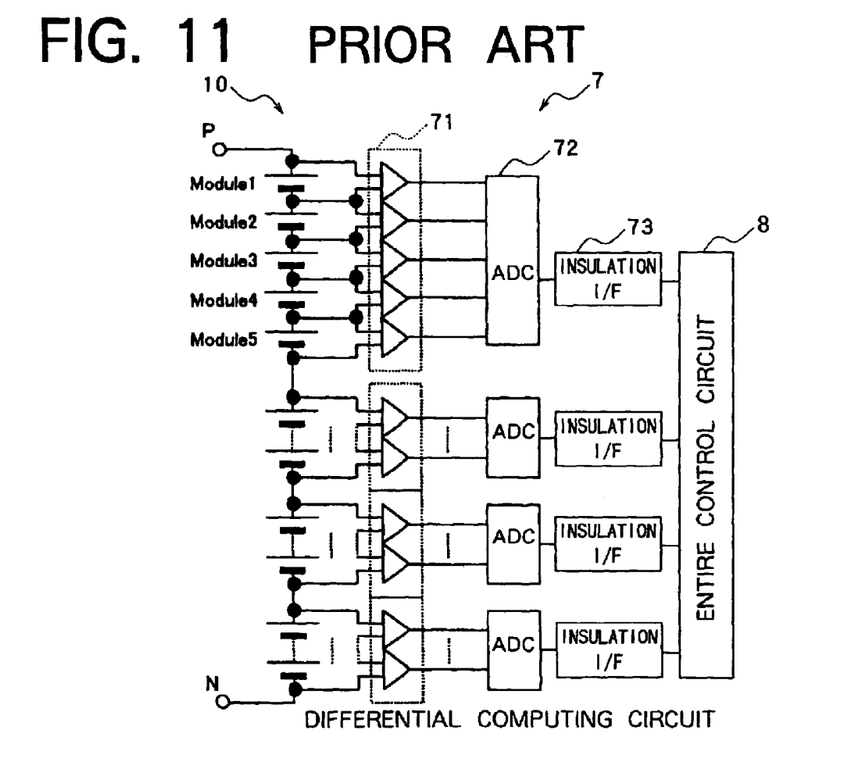
FIG. 11 is a diagram showing the construction of a conventional voltage detecting circuit.

FIG. 11 shows a conventional voltage detecting circuit 7 for monitoring voltage for each module (JP-A No. 11-160367/1999, 11-160371/1999). With reference to FIG. 11, the cell combination 10 is divided into four cell blocks, each comprising five cell modules. For each cell block, a differential computing circuit 71, an analog-to-digital converter 72, and an insulation interface 73 are connected in series to provide a voltage detecting circuit 7 for detecting a cell voltage for each module. In the case of NiMH secondary cells, one module has a voltage of approximately 12 V.

The differential computing circuit 71 detects the difference of the voltage across each of the cell modules, feeding the detection value to the analog-to-digital converter 72 to have the value converted into a digital value, thereafter feeding the value through the insulation interface 73 having a photocoupler, etc., to the entire control circuit 8. Accordingly, the insulation interface 73 interposed electrically insulates the cell combination 10 of high voltage from the entire control circuit 8.

Figure 12:
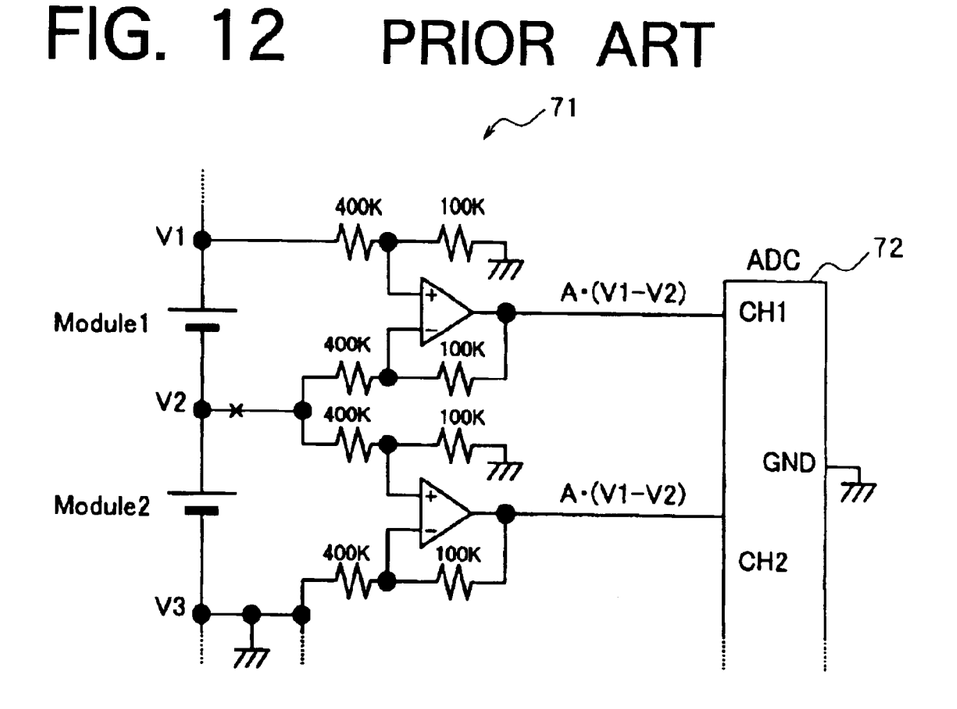
FIG. 12 is a diagram showing the construction of a conventional differential computing circuit.

The differential computing circuit 71, for example, comprises an op-amp, peripheral resistors as shown in FIG. 12 to detect the output voltage of each of the cell modules. For example, an illustrated positive electrode point of a cell module 1 (Module 1) has potential V1 which is a combined amount of voltage of the cell module 1 and the cell module 2 with a negative electrode point of a cell module 2 (Module 2) connected to ground. Opposite terminals of each of the cell modules are connected to the differential computing circuit 71 to detect voltage of each of the cell modules. Then the detected voltage is fed to an analog-to-digital converter 72, obtaining voltage detecting data of each of the cell modules. Accordingly, one of terminals of cell modules is grounded to the earth, to thereby stabilize grounding potential for a cell, realizing accurate differential computing. In this case the analog-to-digital converter 72 shown in FIG. 11 is provided with a grounding.

With reference to FIG. 12, voltage output from each differential computing circuit 71 has a value obtained by multiplying a voltage difference value (V1 to V2) by coefficient A. The coefficient A is so determined at an appropriate value that voltage input to the differential computing circuit 71 falls within the range required for normal A/D conversion. For example, in the case where the voltage measured is in the range of 0 to 20 V, and the analog-to-digital converter 72 has an input range of 0 to 5 V, a resistance value of each resistor shown in FIG. 12 is so designed such that A=5 V/20 V=0.25. The resistance values shown in FIG. 12 fulfill the conditions mentioned.

Furthermore, resolution of the analog-to-digital converter 72 is determined according to the resolution required for detecting a voltage of one cell module. When measured voltage of each of the cell modules is as great as up to 20 V, as shown in FIG. 12, for example, and the voltage is detected in resolution of about several dozens of mV, the resolution R is calculated according to Mathematical Expression 1 given below with use of an analog-to-digital converter 72 of 10 bits.

$$R = 20 \text{ V}/2^{10} = 19.5 \text{ mV} \qquad \text{(Mathematical Expression 1)}$$

However, the conventional voltage detecting circuit 7 shown in FIGS. 10 to 12 needs to be provided with an op-amp and peripheral resistors for each of the cell modules, thereby giving rise to the problem of making the circuit large in size with an increasing number of the modules.

Furthermore, in the event of the disconnection of the voltage detecting line, the behavior of the circuit shown in FIG. 12 is unknown. Assuming that voltage of a module is 12 V, the correct voltage difference value of 3 V (A=0.25) is fed to the channel CH1 of the analog-to-digital converter 72 when the disconnection does not occur. In the case where the disconnection occurs on a position indicated at a cross mark in FIG. 12, for example, the voltage fed to the channel CH1 of the analog-to-digital converter 72 is 5.3 V, and that to CH2 is about 0.7 V. In this case, it is impossible to distinguish between overcharge of the cell module 1 causing the great voltage differential value input and disconnection causing the abnormal value input. Using the cells in combination continuously in the event of the disconnection may cause damage to the cells, so that this case is to be handled as an abnormal situation. Similarly, in checking voltage of the cell module 2, it is difficult to distinguish between over-discharge causing the small voltage differential value input and disconnection causing the abnormal value input.

Furthermore, with the conventional voltage detecting circuit, the detection accuracy is greatly influenced by the errors of the resistors, thereby presenting difficulty in improving the detection accuracy. That is, highly accurate resistors need to be mounted for improving computing accuracy of the differential computing circuit 71 shown in FIG. 12. Because the accuracy of the resistor is usually about 0.5 to 1%, even if a resistor of 0.5% is adopted, the computing error of the differential computing circuit 71 depends on the error of the combined resistance, and reaches about 1%. Accordingly, in the case of an input value of about 12 V, an error of about 120 mV occurs, whereby such accuracy is unsatisfactory in monitoring voltage of cells each having 1.2 V.

On the other hand, already known for improving the detection accuracy is a method of correction-computing by software. In the case where this method is adopted into the differential computing circuit 71 shown in FIG. 12, the correction difference value (A×V1−B×V2) is calculated in place of the calculation of the voltage difference value (V1−V2). Coefficients A, B each expresses a resistance value error. The smaller the resistance value error, the closer to one the coefficient. However, the voltage difference value for the cell module I is influenced by voltage variations of the cell module 2, for example, necessitating extremely complicated processing for correcting a voltage difference value for each of the cell modules by the software.

An object of the present invention is to provide a voltage detecting circuit which is reduced in the number of parts and which nevertheless improves the voltage detection accuracy with ease, and which further detects reliably disconnection occurrence.

SUMMARY OF THE INVENTION

In a cell combination comprising at least one cell block each having a plurality of cell modules connected to each other in series, a voltage detecting circuit of the present invention detecting voltage of each of the cell modules constituting the cell block, the circuit comprising voltage detecting lines extending, respectively, from a plurality of voltage detecting points of the cell block (opposite terminals of the cell block and points of connection between the cell modules), one of the voltage detecting lines being connected to ground, nongrounding voltage detecting lines each being connected to the grounding voltage detecting line via a voltage branch line. A voltage dividing resistor is interposed on each of the nongrounding voltage detecting lines and on each of the voltage branch lines. Each of the nongrounding voltage detecting lines is connected to computing means through analog-to-digital conversion means. The computing means calculates voltage of each of the cell modules according to voltage detecting data input from each of the nongrounding voltage detecting lines.

With the voltage detecting circuit of the present invention, potential of a positive electrode or a negative electrode of each of the cell modules is generated on the voltage detecting lines, respectively, extending from the plurality of voltage detecting points of the cell block. A voltage detecting line (grounding voltage detecting line) is grounded, so that generated on each of the nongrounding voltage detecting lines is potential with reference to the potential of the grounding voltage detecting line (grounding). The potential of each of the nongrounding voltage detecting lines is voltage-divided by a pair of voltage dividing resistors interposed on the nongrounding voltage detecting line and on the voltage branch line interconnected to the nongrounding voltage detecting line. The voltage corresponding to the ratio of these voltage dividing resistors is fed from the nongrounding voltage detecting line to the analog-to-digital conversion means, to be converted into digital voltage detecting data. Each voltage detecting data is further fed to the computing means.

The voltage detecting data fed to the computing means has a value in proportion to potential of the nongrounding voltage detecting line wherein potential of the grounding voltage detecting line is grounding, i.e., has a value in proportion to potential of the positive electrode or the negative electrode of each of the cell modules, so that in the calculation of output voltage of one cell module, a potential difference between the two voltage detecting lines extending from opposite electrodes of the cell module is calculated and then the potential difference calculated is multiplied by a predetermined coefficient corresponding to the ratio of the voltage dividing resistors. This provides output voltage of each of the cell modules.

Accordingly with the voltage detecting circuit of the present invention, the differential computing is not executed by the analog circuit as conventionally, but is executed according to the digital voltage detecting data obtained from the analog-to-digital conversion means to calculate the voltage of each of the cell modules.

Stated specifically, the computing means comprises data correction means for correcting the voltage detecting data to be input through each of the nongrounding voltage detecting lines based on a preset correction method. With the correction calculation, because a voltage detection value obtained through one nongrounding voltage detecting line is not influenced by the voltage variations of the other nongrounding voltage detecting lines, the voltage detecting data to be input through each of nongrounding voltage detecting lines is individually given the correction processing, whereby the correction processing is very easy.

According to another specific construction, the computing means comprises disconnection detecting means for detecting the disconnection of each of the nongrounding voltage detecting lines based on the voltage detecting data to be input from each of the nongrounding voltage detecting lines. In the case where disconnection occurs on one nongrounding voltage detecting line, for example, the potential of the nongrounding voltage detecting line becomes substantially zero, rendering the voltage detecting data obtained through the nongrounding voltage detecting line smaller than voltage detecting data obtained through the other nongrounding voltage detecting lines. This determines that the disconnection occurs on the nongrounding voltage detecting line.

According to another specific construction, interposed between the grounding voltage detecting line and the other voltage detecting line is a disconnection checking circuit for checking the disconnection of the grounding voltage detecting line. The disconnection checking circuit checks whether or not a closed loop circuit including the two voltage detecting lines and one or more cell modules is formed, to check the disconnection. When the disconnection does not occur on the grounding voltage detecting line, electric current can be supplied to the disconnection checking circuit by the grounding voltage detecting line, the other voltage detecting line, and one or more cell modules interposed between the two voltage detecting lines. When the disconnection occurs on the grounding voltage detecting line, current cannot be supplied to the disconnection checking circuit. Accordingly, detecting the capability of electric current supply checks whether the disconnection occurs.

Stated further specifically, connected to ground as a grounding voltage detecting line is a voltage detecting line extending from a voltage detecting point at a most central position among the plurality of voltage detecting points. According to the specific construction, supposing that a current path is formed from each of the cell modules through the nongrounding voltage detecting line and the voltage branch line to the ground. Because one cell module is closer to the cell module from which the grounding voltage detecting line extends, the current path flowing through the one cell module is more overlapped. The current flowing through the cell module from which the grounding voltage detecting line extends becomes a maximum. However, the increase of the current flowing through the cell module from which the grounding voltage detecting line extends is suppressed as far as practicable by the provision of the grounding voltage detecting line at the central position of the cell block.

Stated further specifically, a pair of voltage dividing resistors interposed on a nongrounding voltage detecting line extending from each end terminal of the cell block and on a voltage branch line interconnected to the nongrounding voltage detecting line is set at a smaller resistance value than a pair of voltage dividing resistors interposed on the other nongrounding voltage detecting line and on a voltage branch line interconnected to the nongrounding voltage detecting line. This can further effectively suppress the variations of current flowing into the cell modules among the cell modules.

Further, according to another specific construction, a capacitor is connected in parallel to a voltage dividing resistor interposed on each of the voltage branch lines. Stated specifically, a lowpass filter is formed by the voltage dividing resistor and the capacitor. The lowpass filter reduces a noise component of a voltage signal fed to the analog-to-digital conversion means.

As described above, with the voltage detecting circuit of the present invention, the voltage branch line is interconnected to each of the voltage detecting lines, and the voltage dividing resistor is interposed on each of the voltage detecting lines and on each of the voltage branch lines, to form a simple circuit for detecting potential of each of the voltage detecting lines. Voltage of each of the cell modules is calculated based on the voltage detecting data corresponding to potential of each of the voltage detecting lines, so that the conventional complicated differential computing circuit need not be provided, whereby the number of parts can become smaller than conventionally. Furthermore, the voltage detecting data to be input through each of the nongrounding voltage detecting lines is individually given the correction processing, so that the correction processing is very easy. This can improve the voltage detecting accuracy. The disconnection of the nongrounding voltage detecting line can be reliably detected by monitoring the variations of the voltage detecting data obtained through the nongrounding voltage detecting line.

DETAILED DESCRIPTION OF THE PREFERRED EMBODIMENTS

Figure 1:
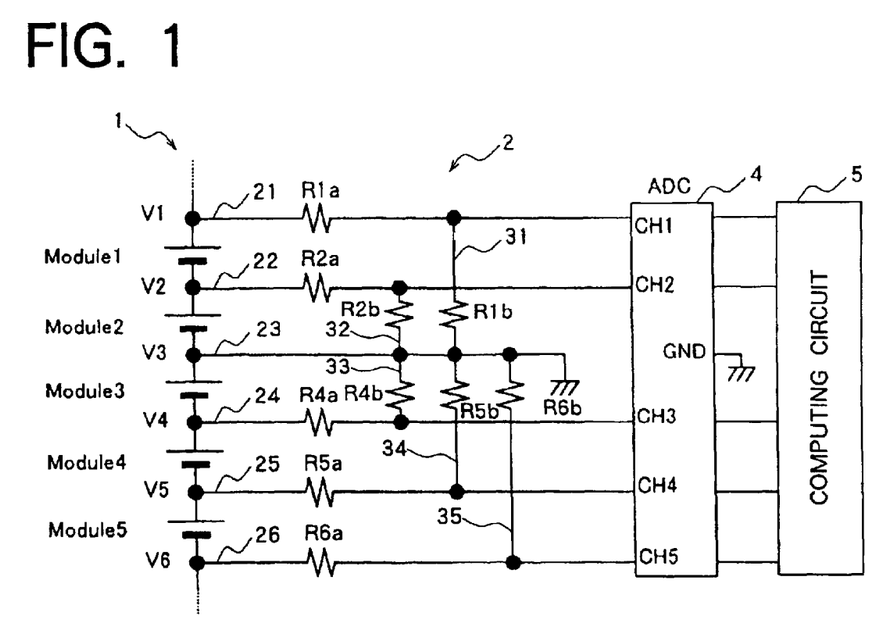
FIG. 1 is a circuit diagram showing the construction of a voltage monitoring system embodying the present invention.

The present invention as applied to a voltage monitoring system of a cells combination for use as a power source of hybrid cars will be described below in detail with reference to the drawings. With the voltage monitoring system embodying the invention, as shown in FIG. 1, five cell modules (Module 1 to Module 5) are connected in series to provide a cell block, and a plurality of cell blocks are connected in series to provide a cell combination 1. The cell combination 1 has connected thereto a voltage detecting circuit 2 for detecting the output voltage of each of the cell modules for each cell block.

With the voltage detecting circuit 2, voltage detecting lines 21, 22, 23, 24, 25, 26 extend, respectively, from a positive electrode point V1 of a cell module (Module 1) positioned on one end portion among five cell modules (Module 1 to Module S), a negative electrode point V6 of another cell module (Module 5) positioned on the other end portion, and points of connection V2 to V5 between cell modules. The voltage detecting line 23 extending from the third point of connection V3 positioned approximately centrally is connected to the ground.

Connected to the grounding voltage detecting line 23 are nongrounding voltage detecting lines 21, 22, 24, 25, 26, respectively, through voltage branch lines 31, 32, 33, 34, 35. Voltage dividing resistors (R1a to R6a, R1b to R6b) are each interposed on the nongrounding voltage detecting lines 21, 22, 24, 25, 26 and on the voltage branch lines 31, 32, 33, 34, 35. The five nongrounding voltage detecting lines 21, 22, 24,25, 26 are connected to five input terminals of an analog-to-digital converter 4 of five channels (CH1 to CH5). The five output terminals of the analog-to-digital converter 4 are each connected to a computing circuit 5 having a microcomputer. A ground terminal GND of the analog-to-digital converter 4 is connected to the ground.

With the voltage detecting circuit 2 described, potential of the five voltage detecting points V1, V2, V4, V5, V6 among the six voltage detecting points V1 to V6 of a cell block, except the third voltage detecting point V3 which is grounded, are voltage-divided by the nongrounding voltage detecting lines, respectively, extending from the voltage detecting points and a pair of voltage dividing resistors interposed on the voltage branch line connected to the nongrounding voltage detecting point, whereby potential generating on the points of connection between the pair of dividing resistors are fed to input terminals, respectively, of the analog-to-digital converter 4. For example, the potential of the first voltage detecting point V1 is voltage-divided by the voltage detecting line 21 extending from the voltage detecting point and the pair of voltage dividing resistors R1a, R1b interposed on the voltage branch line 31, to thereby feed potential generated on a point of connection between the pair of dividing resistors to an input terminal of a first channel CH1 of the analog-to-digital converter 4. The analog-to-digital converter 4 is adapted for the input of both positive and negative values. The converter 4 converts an analog signal input to each input terminal into digital data to be output from each output terminal.

Figure 2:
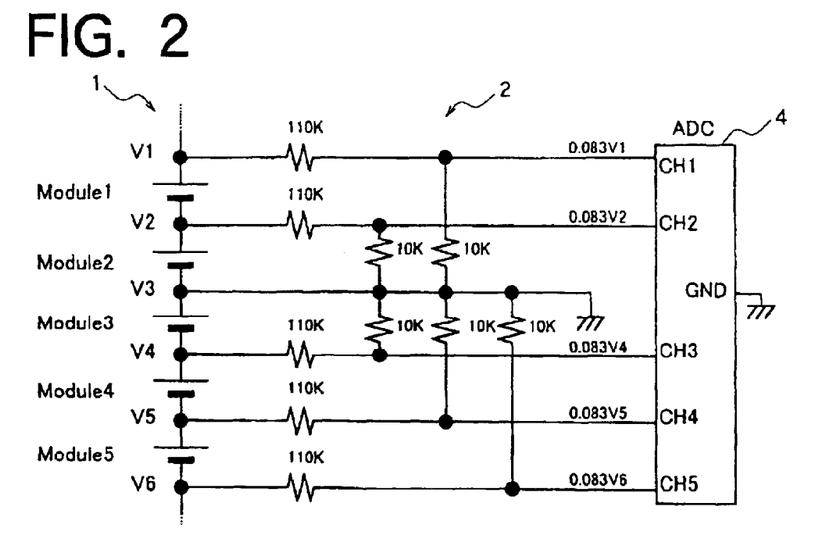
FIG. 2 is a diagram showing a design example of a voltage detecting circuit.

FIG. 2 shows a specific design example of a voltage detecting circuit 2 embodying the invention, wherein output voltage of each of the cell modules is 20 V at a maximum value, and the input range of the analog-to-digital converter 4 is within ±5 V. On a voltage detecting point V6 wherein three cell modules (Module 3 to 5) are connected in series, the maximum voltage of 60 V is generated. In this case, dividing ratio by a pair of dividing resistors is so determined at 0.083 (=5 V/60 V) that input voltage to the analog-to-digital converter 4 falls in the range of ±5 V.

A computing circuit S executes differential computing by software to voltage detecting data V(ch1) to V(ch5) for five channels obtained from the five output terminals of the analog-to-digital digital converter 4 according to Mathematical Expression 2 given below, calculating output voltage V(module-n) of each of the cell modules.

$V(\text{module-1}) = (V(\text{ch1}) - V(\text{ch2}))/10.083$ $V(\text{module-2}) = V(\text{ch2})/0.083$ $V(\text{module-3}) = -V(\text{ch3})/0.083$ $V(\text{module-4}) = (V(\text{ch4}) - V(\text{ch5}))/0.083$ $V(\text{module-5}) = (V(\text{ch5}) - V(\text{ch6}))/0.083$ (Mathematical Expression 2)

In the case where the analog-to-digital converter 4 has the same resolution R, 19.5 mV, for example, as the conventional voltage detecting circuit shown in FIG. 12, the required number of bits of the analog-to-digital converter 4 is calculated from Mathematical Expression 3 given below.

$B = \log_2 (60 \text{ V}/19.5 \text{ mV}) = 12$ bit (Mathematical Expression 3)

Accordingly, the analog-to-digital converter 4 of 12 bits is required for ensuring the same resolution 19.5 mV as in the case of FIG. 12, necessitating an analog-to-digital converter 4 with higher resolution by 2 bits than the analog-to-digital converter 72 shown in FIG. 12. However, no problem arises since progress in semiconductor technology in recent years makes it possible to manufacture an analog-to-digital converter of higher resolution with reduced cost.

Figure 3:
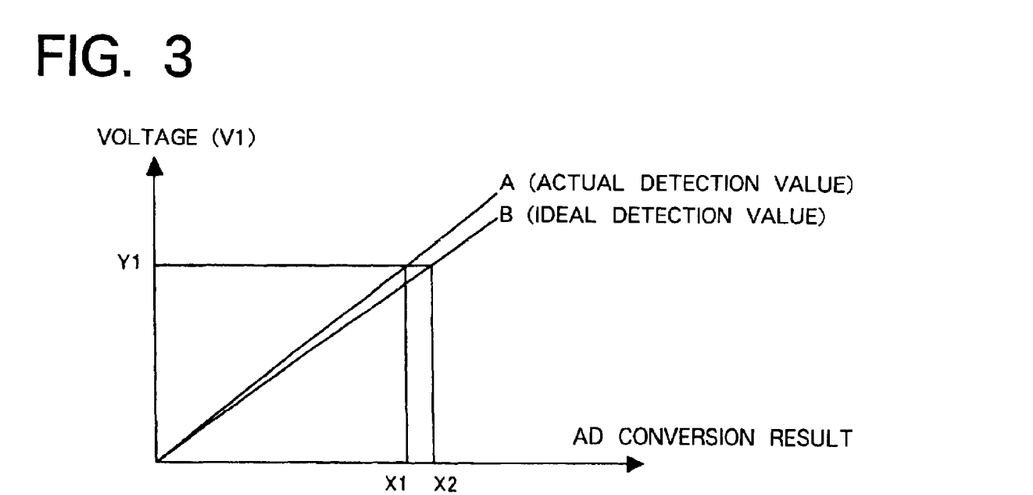
FIG. 3 is a graph for describing a correction method of a voltage detection value.

The voltage detecting circuit 2 of the present invention performs correction computing by software in order to improve voltage detecting accuracy as will be stated below. FIG. 3 shows the relationship between AD conversion result from the analog-to-digital converter 4 and an actual voltage. When AD conversion result is X1, the value Y1 of voltage value V1 is obtained by multiplying X1 by 12 (=1/0.083).

Actually, however, some errors will be produced by errors in resistance values. With reference to FIG. 3, idealistically, suppose the value of X2 is converted to X1 because of resistance error. Accurate voltage value Y can be obtained from AD conversion result X according to Mathematical Expression 4 given below, with coefficient (X2/X1) pre-stored in the computing circuit 5.

$Y = (X2/X1) \times 12 \times X$ (Mathematical Expression 4)

The value of coefficient (X2/X1) is stored as an individual value corresponding to respective voltage detecting points V1 to V6, in a nonvolatile memory such as an EEPROM, etc.

The potential of the voltage detecting points V1 to V6 can be measured accurately by the execution of the correction calculation, to thereby execute the differential computing of the computing circuit 5 with high accuracy. In the case where more accurate correction is required, it is effective to adopt a correction Equation of Mathematical Expression 5 given below and using two coefficients A, B.

$Y = A \times X B$ (Mathematical Expression 5)

Figure 4:
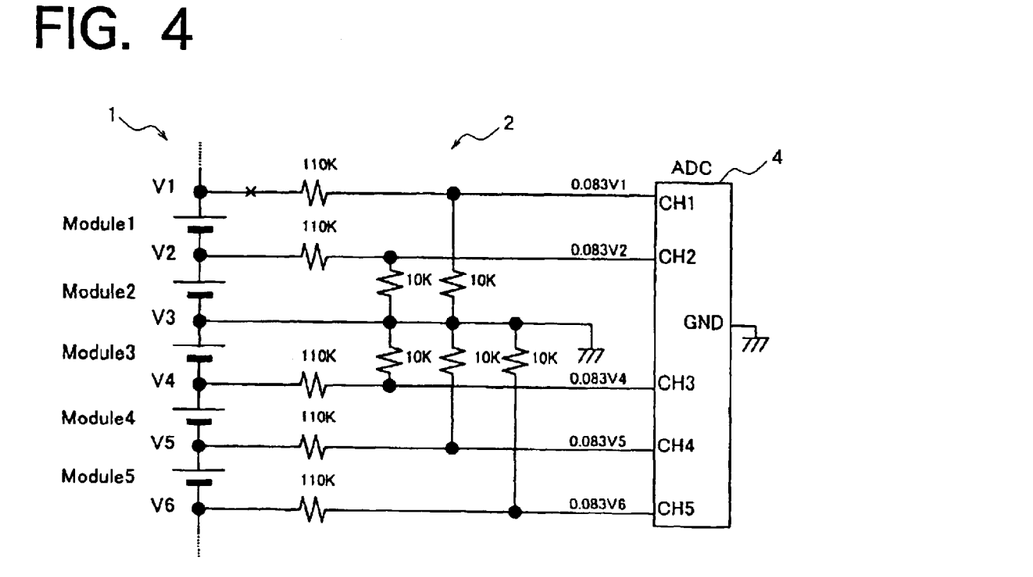
FIG. 4 is a circuit diagram for describing a disconnection detecting method.

The disconnection occurrence on the nongrounding voltage detecting line is detected as will be described below. For example, when the disconnection occurs on a nongrounding voltage detecting line extending from a first voltage detecting point V1 as indicated at a cross mark in FIG. 4, a voltage detection value to be input to an input terminal of the channel CH1 of the analog-to-digital converter 4 is approximately zero which is below the value of the channel CH2. There is no possibility of the cell module voltage becoming negative in the actual usage range of the cell, whereby the disconnection occurrence is detected. Accordingly, the disconnection occurrence on the nongrounding voltage detecting line can be detected by monitoring the input values to the analog-to-digital converter 4 or the output values of the analog-to-digital converter 4.

Figure 5:
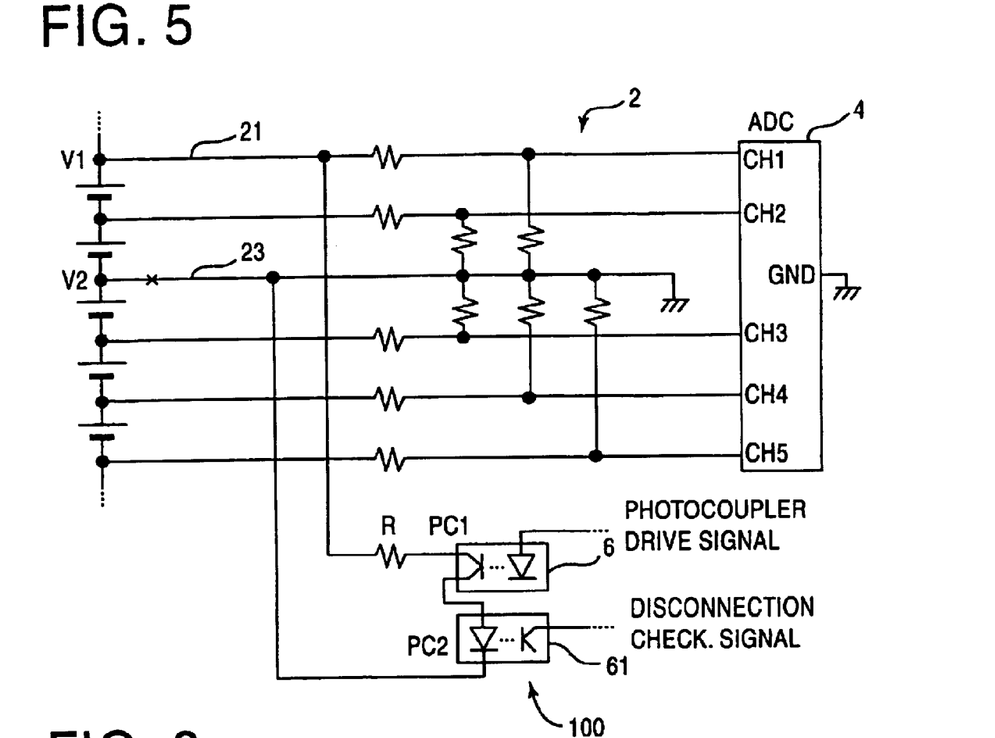
FIG. 5 is a diagram showing the construction of a disconnection checking circuit.

On the other hand, for the detection of the disconnection of the grounding voltage detecting line 23, as shown in FIG. 5, a disconnection detecting circuit 100 is provided, which circuit has a current limiting resistor R and a second photocoupler 61 and a first photocoupler 6 which are interposed between the grounding voltage detecting line 23 and a given nongrounding voltage detecting line 21. With the disconnection detecting circuit 100, a drive signal is fed to light-emitting diodes of the first photocoupler 6, turning on a phototransistor. Accordingly, a current path is formed from the nongrounding voltage detecting line 21, through the resistor R, the phototransistor of the first photocoupler 6, and the light-emitting diodes of the second photocoupler 61, to the grounding voltage detecting line 23 with a power source of one or more cell modules interposed between the nongrounding voltage detecting line 21 and the grounding voltage detecting line 23, whereby current flows to the light-emitting diodes of the second photocoupler 61. As a result, the phototransistor of the second photocoupler 61 is turned on.

In the event of the disconnection occurrence on the grounding detecting line 23 as indicated at a cross mark in the drawing, even if the phototransistor of the first photocoupler 6 is turned on, the current path is held open, so that no current flows to the light-emitting diodes of the second photocoupler 61. The phototransistor of the second photocoupler 61, therefore, is held off. Because the voltage dividing resistor (several hundreds kΩ) constituting the voltage detecting circuit 2 has an extremely higher resistance value than a resistor R (several hundreds Ω) for limiting current to the first photocoupler 6, current flowing through the voltage dividing resistor does not turn on the phototransistor of the first photocoupler 6.

As described above, the disconnection detecting circuit shown in FIG. 5 uses "on/off" of the phototransistor of the second photocoupler 61 as a disconnection checking signal to detect the disconnection occurrence on the grounding voltage detecting line 23.

Figure 6:
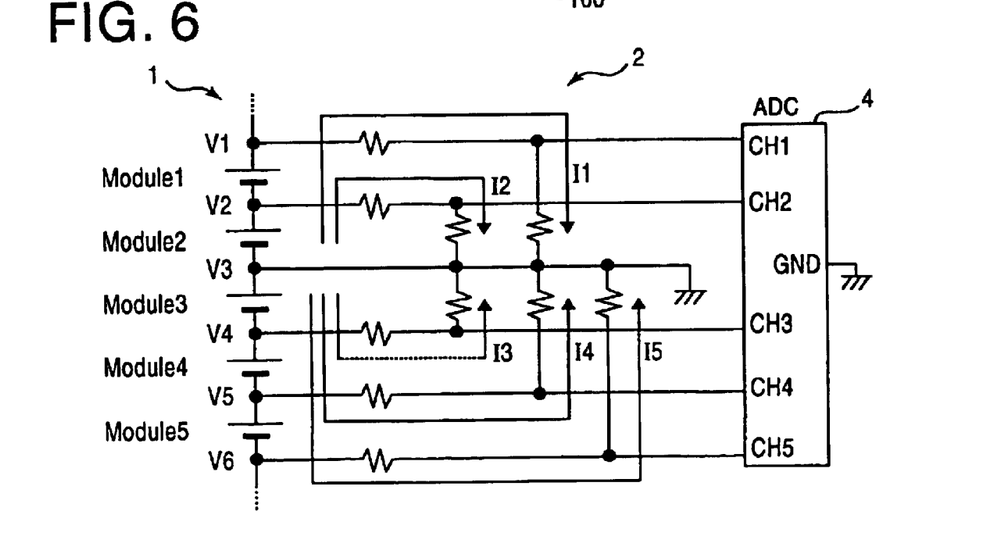
FIG. 6 is a diagram for describing the values of current flowing into each of the cell modules.

Next, load balance generated by the current flowing through the voltage dividing resistor will be described with reference to FIG. 6. As shown with arrows in the drawing, while current I1 flows through the cell module 1 and the cell module 2, current I2 flows only through the cell module 2, generating a difference between the current flowing through the cell module 1 and that flowing through the cell module 2, whereby more current flows through the cell module 2 more than through the cell module by the amount of the current I1. Similarly, there is a difference among currents I3, I4, and I5 shown in FIG. 6, whereby more current flows through the cell module 3 than through the cell module 5 by the amount of the current I4 and I5. As a result, charge of each cell module differs in decreasing speed, generating the variations of remaining amount among the cell modules. The variations of remaining amount causes the overcharge as described, entailing a problem of shortening the cell life.

Figure 7:
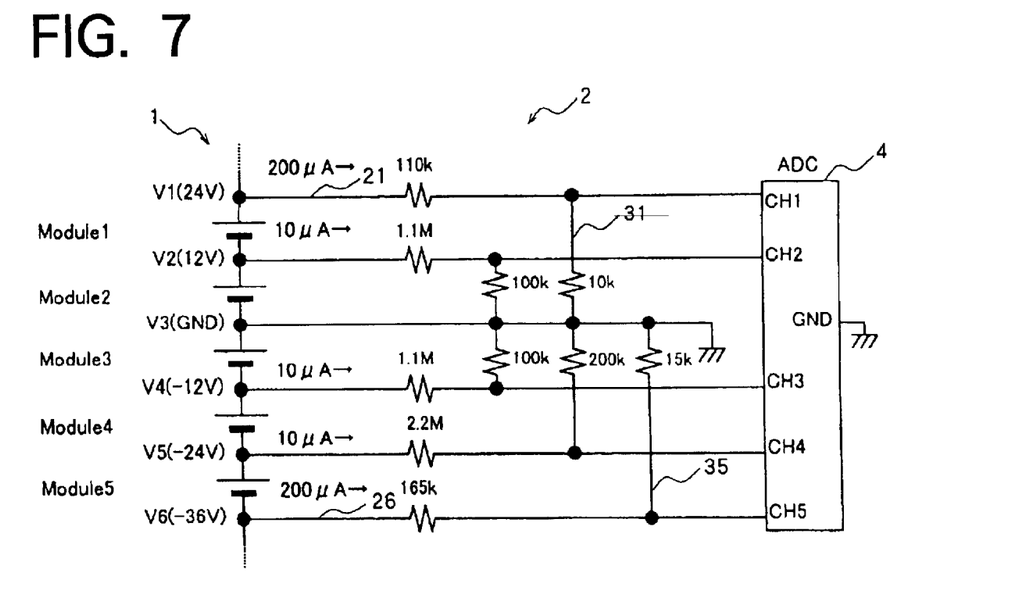
FIG. 7 is a diagram showing another design example of a voltage detecting circuit.

In order to make current flowing into each of the cell modules equivalent, it is effective that the current I2 is set small so as to be negligible compared to the current I1, and the current I3 and I4 is set small so as to be negligible compared to the current I5. FIG. 7 shows a circuit constant of the voltage detecting circuit 2 subjected to such measure as described. As illustrated, a pair of voltage dividing resistors interposed on the nongrounding voltage detecting lines 21, 26 extending from the most outer voltage detecting points V1, V6 and on the voltage branch lines 31, 35 interconnected to the nongrounding voltage detecting lines, respectively, are each set at a smaller resistance value than a pair of voltage dividing resistors interposed on the other nongrounding voltage detecting lines and on the voltage branch lines interconnected to the other nongrounding voltage detecting lines, respectively. This makes current flowing through each of the cell modules 1 to 5 approximately equivalent.

Table 1 given below shows current values flowing through each of the cell modules, and the calculation results of the variations from the average of the current values.

TABLE 1

|  | Current value (μA) | Variations (%) |
| --- | --- | --- |
| Cell module 1 | 200 | −3.8 |
| Cell module 2 | 210 | +0.9 |
| Cell module 3 | 220 | +5.8 |
| Cell module 4 | 210 | +0.9 |
| Cell module 5 | 200 | −3.8 |
| Average of current | 208 | — |

As will be apparent from Table 1, the variations of the current flowing through each of the cell modules are all below several percent, to be negligible. As the number of the cell modules constituting one cell block is increased, the variations of current flowing through each of the cell modules becomes great. However, the voltage detecting lines to be grounded extend from a central voltage detecting point, as far as practicable, whereby the variations of current flowing through each of the cell modules can be as small as possible.

Figure 8:
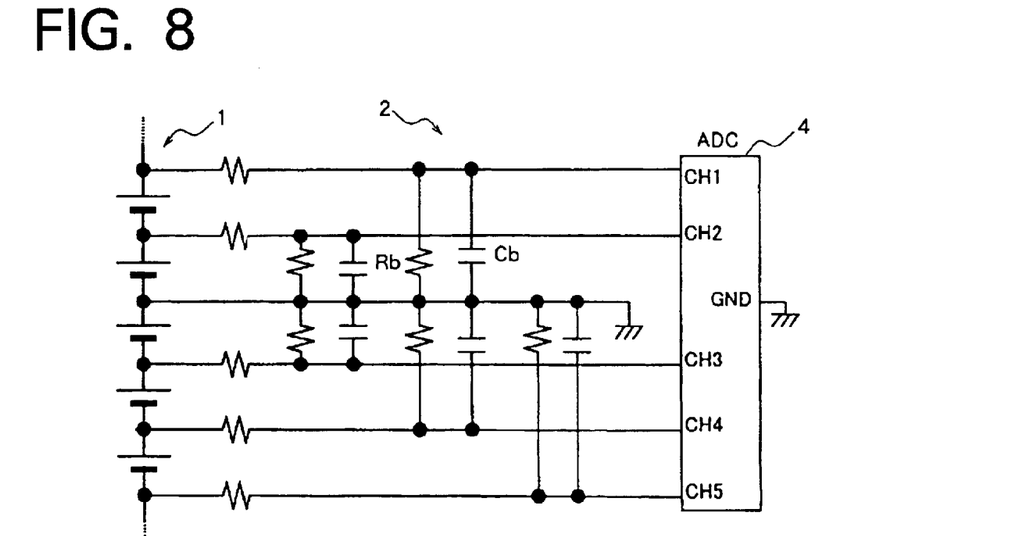
FIG. 8 is a diagram showing a voltage detecting circuit constituting a lowpass filter.

Furthermore, with the current detecting circuit 2 shown in FIG. 8, a capacitor Cb is connected in parallel with a voltage dividing resistor Rb interposed on each of the voltage branch lines, to form a lowpass filter with the voltage dividing resistor Rb and the capacitor Cb. This reduces a noise component contained in a voltage signal to be input to the analog-to-digital converter 4, to thereby provide an AD conversion value with high accuracy. Accordingly, with the present embodiment, the lowpass filter is provided using the voltage dividing resistors, so that the number of parts is increased very slightly. With the voltage detecting circuit 2 of the invention, because all the detected voltage is AD-converted to thereafter execute the differential computing, the detected voltage needs to be held unchanged until all the AD-conversion processing is completed. For this reason, measures given below are effective.

1) Time constant (Rb×Cb) of each filter is made uniform.
2) Time constant of each filter is set sufficiently longer than AD conversion time for all the channels.

According to the measure 1), time required for the detected voltage to reach steady state after the detected voltage varying can be made uniform. According to the measure 2), the variations in detected voltage can be suppressed until the AD-conversion processing of all the channels is completed.

Figure 9:
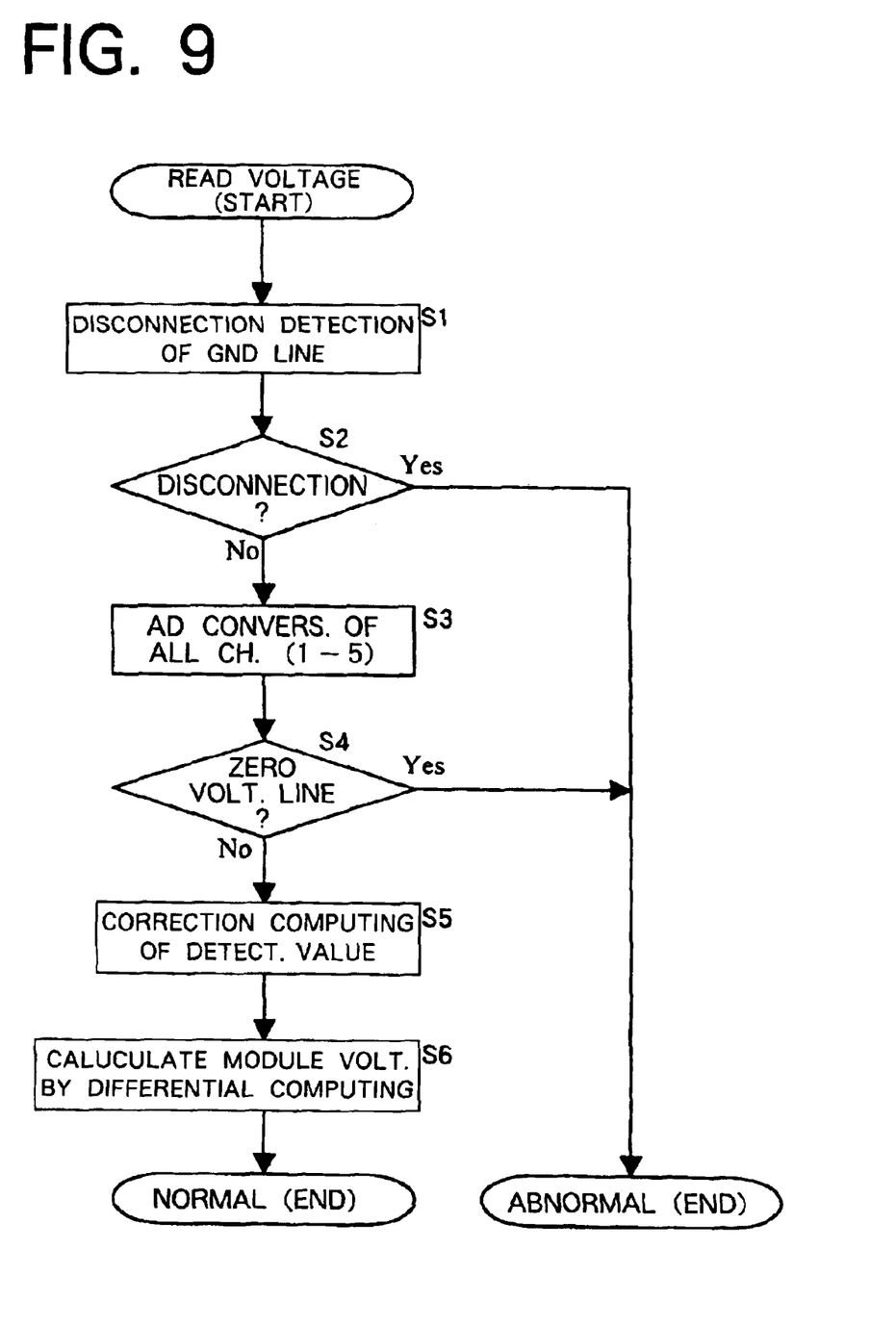
FIG. 9 is a flow chart showing a sequence of AD conversion processing performed by the voltage detecting circuit and voltage checking processing.

FIG. 9 is a flow chart showing the AD-conversion processing and the voltage checking processing performed by the voltage detecting circuit 2 embodying the present invention. First in step S1 the disconnection detection of the grounding voltage detecting line (GND line) is performed. In step S2 an inquiry is made as to whether the disconnection occurs. When the disconnection is detected, the result of the AD conversion is indeterminate, to complete a sequence of steps in the state of "abnormality (END)". When the disconnection does not occur on the grounding voltage detecting line, step S3 follows wherein the analog-to-digital converter 4 executes the AD conversion to all the channels.

Subsequently in step S4, an inquiry is made as to whether or not, with reference to the AD conversion results, potential of one of the voltage detecting lines becomes approximately zero. If the answer is affirmative, the voltage detecting line is disconnected, to be unable to execute normal differential computing, to thereby complete a sequence of steps in the state of "abnormality (END)". On the other hand, if the answer for step S4 is negative, none of the voltage detecting lines is disconnected, to execute the correction calculation to the voltage detecting data based on a preset correction value. In the case where there is no need for highly accurate detection in particular, the correction calculation can be eliminated. Finally in step S6, the differential computing is executed to calculate voltage of each of the cell modules, to complete a sequence of steps in the state of "normality (END)".

The voltage detecting circuit of the present invention comprises a simple circuit having voltage dividing resistors interposed on each of the voltage detecting lines and on each of the voltage branch lines, detecting potential of each of the voltage detecting lines, to execute the differential computing to the voltage detecting data obtained through each of the voltage detecting lines, calculating voltage of each of the cell modules. Therefore, the circuit need not be provided with the conventional differential computing circuit having a complicated construction, whereby the number of parts can become smaller than conventionally. Furthermore, the voltage detecting data to be input through each of the nongrounding voltage detecting lines is individually given the correction processing, so that the correction processing is extremely easy, whereby the voltage detection accuracy can be improved. Further, the disconnection of the nongrounding voltage detecting line and of the grounding detecting line can be detected reliably.

The circuit of present invention is not limited to the foregoing embodiment in construction but can be modified variously within the technical scope as set forth in the appended claims. For example, although voltage of each of the cell modules is detected according to the foregoing embodiment, each of secondary cells can be also detected.

What is claimed is:

1. In a cell combination comprising at least one cell block each having a plurality of cell modules connected to each other in series, a voltage detecting circuit for the cell combination which circuit detects voltage of each of the cell modules constituting one cell block, wherein voltage detecting lines extend, respectively, from a plurality of voltage detecting points of the cell block, a voltage detecting line extending from a voltage detecting point at a most central position or an approximately central position among the plurality of voltage detecting points is connected to ground, each of the nongrounding voltage detecting lines is connected to the grounding voltage detecting line via a voltage branch line, a voltage dividing resistor is interposed on each of the nongrounding voltage detecting lines and on each of the voltage branch lines, each of the nongrounding voltage detecting lines is connected to computing means through analog-to-digital conversion means, the computing means calculates voltage of each of the cell modules according to voltage detecting data to be input from each of the nongrounding voltage detecting lines.

2. A voltage detecting circuit according to claim 1, wherein the computing means comprises data correction means for correcting the voltage detecting data to be input through each of the nongrounding voltage detecting lines based on a preset correction method.

3. A voltage detecting circuit according to claim 1, wherein the computing means comprises disconnection detecting means for detecting the disconnection of each of the nongrounding voltage detecting lines based on the voltage detecting data to be input from each of the nongrounding voltage detecting lines.

4. A voltage detecting circuit according to claim 1, wherein a disconnection checking circuit for checking the disconnection of the grounding voltage detecting line is interposed between the grounding voltage detecting line and the other voltage detecting line, and the disconnection checking circuit checks whether or not a closed loop circuit including the two voltage detecting lines and one or more cell modules is formed, to check the disconnection.

5. A voltage detecting circuit according to claim 1, wherein a pair of voltage dividing resistors interposed on a nongrounding voltage detecting line extending from each end terminal of the cell block and on a voltage branch line interconnected to the nongrounding voltage detecting line is set at a smaller resistance value than a pair of voltage dividing resistors interposed on the other nongrounding voltage detecting line and on a voltage branch line interconnected to the nongrounding voltage detecting line.

6. A voltage detecting circuit according to claim 1, wherein a capacitor is connected in parallel with a voltage dividing resistor interposed on each of the voltage branch lines.

7. A voltage detecting circuit according to claim 6, wherein a lowpass filter comprises the voltage dividing resistor and the capacitor which are connected to each other in parallel, and time constants of a plurality of lowpass filters formed by a plurality of the voltage branch lines are made uniform or approximately uniform.

8. A voltage detecting circuit according to claim 6, wherein a lowpass filter comprises the voltage dividing resistor and the capacitor which are connected to each other in parallel, and time constants of a plurality of lowpass filters formed by a plurality of the voltage branch lines is each set sufficiently longer than conversion processing time, wherein the analog-to-digital conversion means performs processing of all the detected voltages.

* * * * *